United States Patent [19]

Komiya

[11] Patent Number: 4,567,465
[45] Date of Patent: Jan. 28, 1986

[54] METHOD AND APPARATUS FOR CONVERTING ANALOG SIGNAL INTO DIGITAL SIGNAL

[75] Inventor: Koji Komiya, Hachioji, Japan

[73] Assignee: Iwatsu Electric Co., Ltd., Tokyo, Japan

[21] Appl. No.: 493,610

[22] Filed: May 11, 1983

[30] Foreign Application Priority Data

May 25, 1982 [JP] Japan .................................. 57-88504
Apr. 6, 1983 [JP] Japan .................................. 58-61314

[51] Int. Cl.⁴ ........................................... H03K 13/02
[52] U.S. Cl. ...................... 340/347 AD; 340/347 NT
[58] Field of Search ................ 340/347 DA, 347 NT, 340/347 CC

[56] References Cited

U.S. PATENT DOCUMENTS

| | | | |
|---|---|---|---|
| 4,164,733 | 8/1979 | Landsburg et al. | 340/347 NT |
| 4,210,903 | 7/1980 | La Brie | 340/347 NT |
| 4,383,246 | 5/1983 | Munt | 340/347 NT |
| 4,395,701 | 7/1983 | Evans | 340/347 NT |
| 4,484,177 | 11/1984 | Jobaggy | 340/347 NT |

OTHER PUBLICATIONS

"Precision DVM has Wide Dynamic Range and High Systems Speed", Lawrence T. Jones et al., Hewlett-Packard Journal, vol. 32, No. 4, Apr. 1981, pp. 25-31.

*Primary Examiner*—Vit W. Miska
*Attorney, Agent, or Firm*—Woodcock Washburn Kurtz Mackiewicz & Norris

[57] ABSTRACT

An A-D converter includes an integrator, a measured voltage supply circuit, first and second reference input supply circuits, first and second voltage level detecting circuits, a charge transfer circuit, a clock pulse generator, and a counter. The integrator has first and second integrating capacitors. After a first reference input is supplied, charge in the first integrating capacitor is transferred to the second integrating capacitor through a charge transfer circuit. As a result, voltage of the second capacitor is raised. A second reference input is supplied to the second integrating capacitor. A counter counts clock pulses during the period of supplying the first reference input and the period of supplying the second reference input. The measured voltage in analog system is converted into digital signal based on the period of supplying the measured voltage, the period of supplying the first reference input, the period of supplying the second reference input, value of the first reference input and value of the second reference input.

16 Claims, 12 Drawing Figures

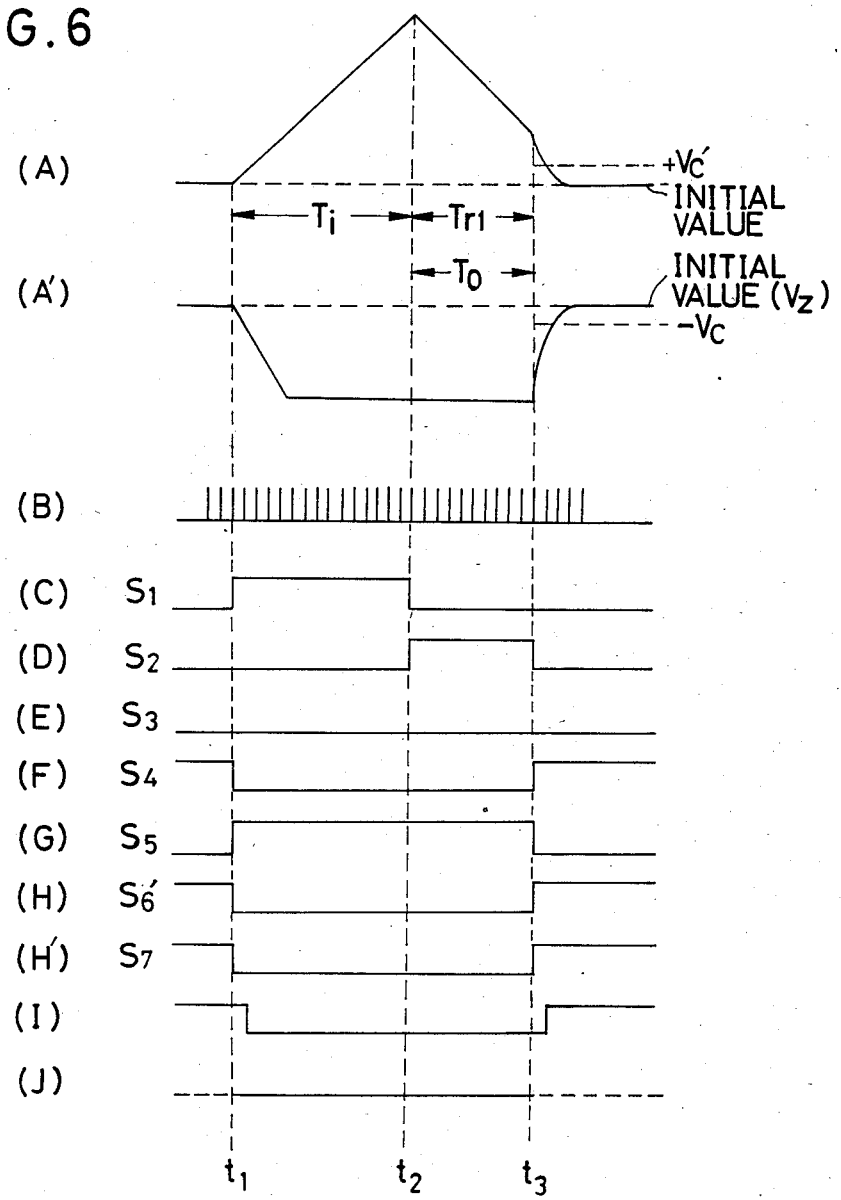

METHOD AND APPARATUS FOR CONVERTING ANALOG SIGNAL INTO DIGITAL SIGNAL

BACKGROUND OF THE INVENTION

The present invention relates to method and apparatus for converting analog signal into digital signal using an integrator.

When measured voltage is converted into digital output using well-known dual integration type analog-to-digital converter (hereinafter referred to as "A-D converter") an integrator including an integrating capacitor is first supplied with the measured voltage of one polarity only for a given period. Next, reference voltage having opposite polarity to the measured voltage is supplied until output voltage of the integrator returns to the initial value before supplying the measured voltage. Furthermore, the supply period of the reference voltage is measured by counting the clock pulses using a counter. As a result, digital output corresponding to the measured voltage can be obtained based on output of the counter. Accuracy of conversion using the dual integration type A-D converter is dependent on the measuring accuracy during the period supplying the reference voltage. In order to raise the conversion accuracy without decreasing the speed of analog-to-digital conversion, it is required that the repetition frequency of clock pulses is raised and that the time at which output voltage of the integrator returns to the initial value is detected with little time delay. However, it is difficult that such requirement be satisfied using dual integration type A-D converter.

Disadvantages in the above-mentioned dual integration type A-D converter can be eliminated by tripple integration type A-D converter such as disclosed in "HEWLETT-PACKARD JOURNAL" published on April 1981. The tripple integration type A-D converter changes level of the reference voltage. That is, when supply of the reference voltage is beginned and output voltage of the integrator approaches the initial value, level of the reference voltage is lowered. As a result, output voltage of the integrator slowly approaches the initial value. Thereby requirement of high speed for detecting the output voltage of the integrator returning to the initial value is relaxed.

However, when the initial value of output voltage of the integrator is detected, since variation of output voltage of the integrator with respect to one count of the counter, i.e. one period of clock pulse is quite small, initial value detecting capability of the detector must be raised. For example, when the measured voltage is 10 volt and output voltage of the integrator is 10 volt and it is assumed that analog-to-digital conversion is carried out at the resolution of 1/1,000,000, one count of the counter corresponds to 10 $\mu$V therefore the detecting capability of 10 $\mu$V is required to detect the initial value.

If maximum output, i.e. output amplitude of the integrator is enlarged when the measured voltage is integrated, detection of the initial value is made easy. However, in view of voltage-resistant property of the integrator and the power source capacity, maximum output voltage cannot be raised without limitation.

SUMMARY OF THE INVENTION

An object of this invention is to provide method and apparatus for converting analog signal into digital signal at high accuracy and high speed.

Another object of this invention is to provide method and apparatus for converting analog signal into digital signal, wherein normal analog-to-digital conversion can be started rapidly even if excessive measured voltage is supplied.

Method for converting analog signal into digital signal according to this invention uses an integraor having first and second integrating capacitors connected in parallel with each other, and comprises step of integrating the measured voltage of one polarity, i.e. analog signal only for a predetermined period. After completing the integration of measured voltage, the integrator integrates a first reference input with polarity being opposite to one polarity. When output voltage of the integrator attains a predetermined detecting voltage level, charge in the first integrating capacitor is transferred to the second integrating capacitor, and the first integrating capacitor is substantially disconnected from the integrator. If charge in the first integrating capacitor is transferred to the second integrating capacitor, amplitude of output voltage in the integrator is enlarged. After completing the transfer of charge, the second reference input is integrated based on the second integrating capacitor. The time when output voltage of the integrator attains value before the integration starting, i.e. the initial value is detected. Measurement of the period supplying the first reference input and the period supplying the second reference input is carried out by counting clock pulses using the counter. Digital output is obtained based on the known predetermined period of supplying the measured voltage, the measured period of supplying the first and second reference input, and the known first and second input.

Apparatus for converting analog signal into digital signal according to this invention comprises an integrator, means for supplying the measured voltage, means for supplying first reference input, means for detecting the first voltage level, means for controlling the first reference input supply means, charge transfer means, means for supplying second reference input, means for detecting the second voltage level, clock pulse generating means, and counting and output means.

In a preferred embodiment of this invention, the integrator comprises an operational amplifier and first and second integrating capacitors connected between input and output terminals of the operational amplifier. Means for supplying the measured voltage comprises input terminal for supplying the measured voltage and a switch for supplying the measured voltage only for a predetermined period. Means for supplying the first reference input includes a switch for supplying the first reference voltage or first reference current selectively to the integrator. Means for detecting the first and second voltage level comprises the first and second comparators. Means for controlling the first reference input supply means comprises a microprocessor to control a switch of the first reference input supply means in response to detecting signal obtained from the first voltage level detecting means. Charge transfer means includes a switch for connecting one end of the first integrating capacitor to the ground in response to output of the first voltage level detecting means, and a switch for disconnecting one end of the first integrating capacitor from output terminal of the integrator. Means for supplying the second reference input includes a switch for supplying the second reference voltage or second reference current only for a selected period. Counting and output means comprises a microprocessor including a control circuit, a counter and an arithmetic circuit.

The above and other objects, features and advantages of this invention and the manner of attaining them will become more apparent, and the invention itself will best be understood, from a study of the following description of a preferred embodiment illustrated in the attached drawings.

BRIEF DESCRIPTION OF THE DRAWINGS

FIG. 6 is a waveform chart in various stages of the A-D converter in FIG. 3 when excessive measured voltage is supplied thereto;

DESCRIPTION OF THE PREFERRED EMBODIMENT

Figure 1:
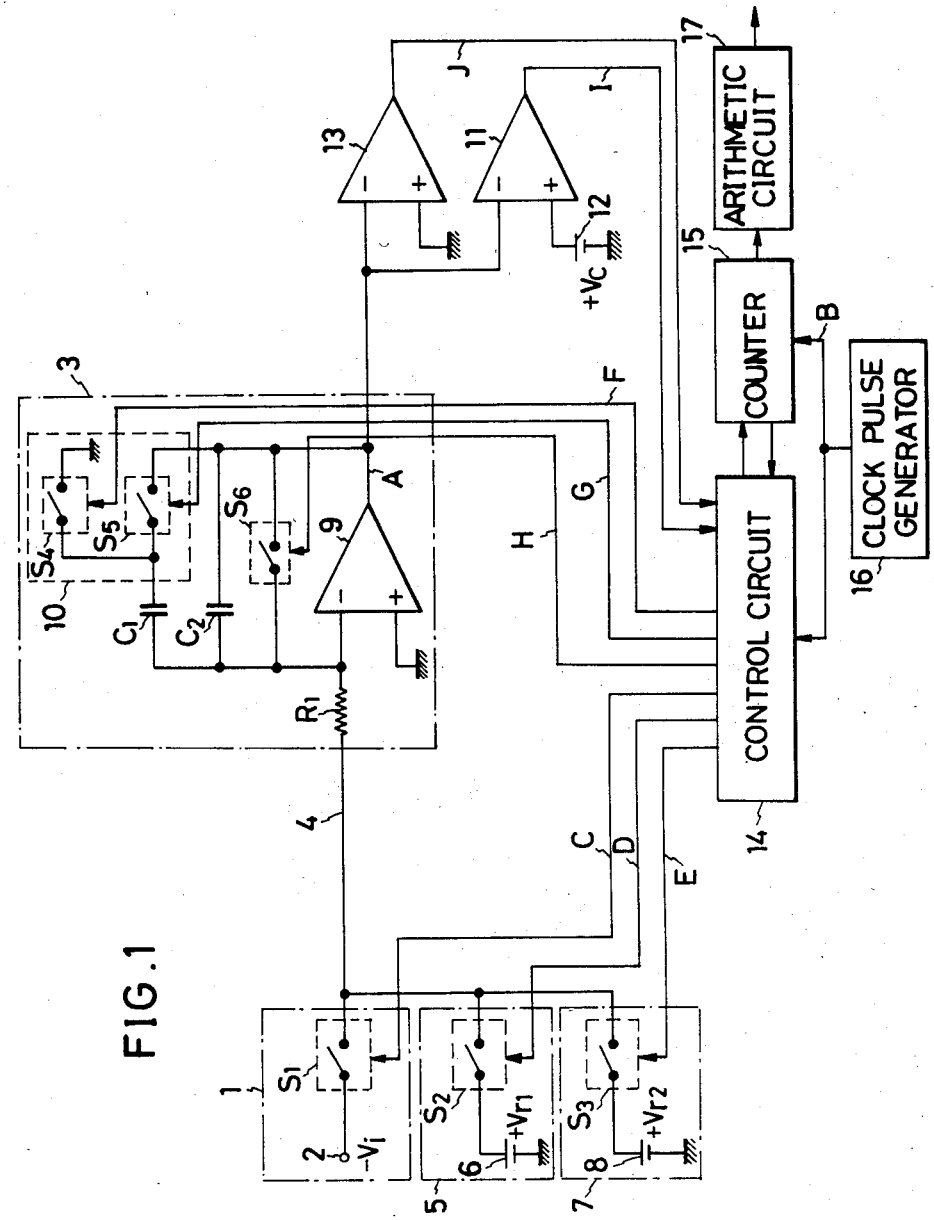
FIG. 1 is a circuit diagram of an A-D converter as an embodiment of this invention.

In FIG. 1 illustrating an A-D converter as an embodiment of this invention, a measured voltage supply circuit 1 comprises an input terminal for supplying a measured voltage $-Vi$ of negative polarity and a first switch $S_1$ for connecting the input terminal 2 to an input line 4 of an integrator 3 only for a predetermined period Ti. A first reference input supply circuit 5 comprises a first reference voltage source 6 for supplying a first reference voltage $+Vr_1$ of positive polarity being opposite to that of the measured voltage and a second switch $S_2$ for connecting the first reference voltage source 6 to the integration input line 4 only for a commanded period. A second reference input supply circuit 7 comprises a second reference voltage source 8 for supplying a second reference voltage $+Vr_2$ being lower than the first reference voltage $+Vr_1$ and a third switch $S_3$ for connecting the second reference voltage source 8 to the integration input line 4 only for a commanded period.

The integrator 3 includes an input resistor $R_1$, an operational amplifier 9, a first integrating capacitor $C_1$, and a second integrating capacitor $C_2$. Inverting input terminal of the operational amplifier 9 is connected through the resistor $R_1$ to the input line 4, and non-inverting input terminal thereof is connected to the ground. One end of the first integrating capacitor $C_1$ is connected through a fourth switch $S_4$ to the ground and through a fifth switch $S_5$ to output terminal of the operational amplifier 9. Other end of the first integrating capacitor $C_1$ is connected to inverting input terminal of the operational amplifier 9. The second integrating capacitor $C_2$ is fixedly connected between output terminal and inverting input terminal of the operational amplifier 9, and has a capacitance value less than that of the first integrating capacitor $C_1$.

A charge transfer circuit 10 comprises the fourth switch $S_4$ and the fifth switch $S_5$. When the fifth switch $S_5$ is turned off and the fourth switch $S_4$ is turned on, charge in the first integrating capacitor $C_1$ is transferred to the second integrating capacitor $C_2$.

A sixth switch $S_6$ to reset the integrator 3 is connected across the second integrating capacitor $C_2$.

A first voltage level detecting circuit comprises a first comparator 11 and a reference voltage source 12. Inverting input terminal of the first comparator 11 is connected to output terminal of the operational amplifier 9 so as to detect the time when integration output voltage based on integration of the first reference voltage $+Vr_1$ becomes a predetermined detecting voltage level $+Vc$. Non-inverting input terminal of the comparator 11 is connected to the reference voltage source 12 to supply the first detecting voltage level $+Vc$.

A second voltage level detecting circuit comprises a second comparator 13. Inverting input terminal of the second comparator 13 is connected to output terminal of the operational amplifier 9 so as to detect that output voltage of the operational amplifier 9 becomes an initial value based on integration of the second reference voltage $+Vr_2$. Non-inverting input terminal of the comparator 13 is connected to the ground so as to provide the ground level corresponding to the initial value.

Figure 2:
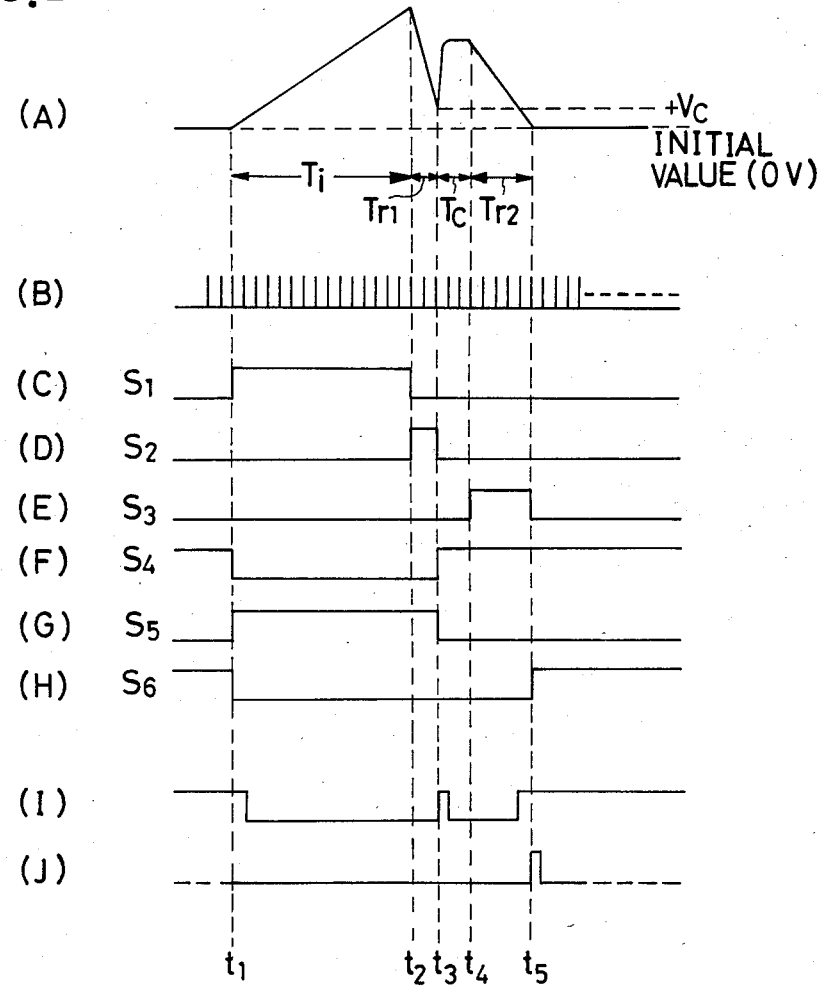
FIG. 2 is a waveform chart illustrating operation of the A-D converter in FIG. 1.

A control circuit 14 generates control signals for the switches $S_1-S_6$ as shown in time chart of FIG. 2 in response to starting operation of analog-to-digital conversion, output of the first comparator 11 and the second comparator 13, and output of a counter 15. The digital counter 15 is controlled by the control circuit 14, and counts clock pulse generated from a clock pulse generator 16 during integration of the first and second reference voltage. An arithmetic circuit 17 receives output of the counter 15 and performs processing to obtain digital output corresponding to the measured voltage.

The control circuit 14, the counter 15 and the arithmetic circuit 17 are constituted by a microprocessor. Each of the switches $S_1-S_6$ is constituted by an electronic switch.

Operation of the A-D converter shown in FIG. 1 will now be described referring to waveform chart of FIG. 2.

Before the time $t_1$ to begin the integration of measured voltage, as clearly seen from FIG. 2 (C) (D) (E) (F) (G) and (H) illustrating waveform of control signals in first through sixth switches $S_1-S_6$ respectively, the fourth switch $S_4$ and the sixth switch $S_6$ are turned on and the first switch $S_1$, second switch $S_2$, third switch $S_3$ and fifth switch $S_5$ are turned off. Therefore output voltage of the integrator 3 shown in FIG. 2(A) has the initial value (0 volt).

At the first time $t_1$ of FIG. 2, the control circuit 14 generates signals to turn the first switch $S_1$ and the fifth switch $S_5$ on and to turn the fourth switch $S_4$ and the sixth switch $S_6$ off. As a result, the measured voltage $-Vi$ in the input terminal 2 is supplied to the integrator 3 through the switch $S_1$. At the time $t_1$, the first integrating capacitor $C_1$ is disconnected from the ground by the switch $S_4$ and connected to output terminal of the operational amplifier 9 by the switch $S_5$. In this state, two integrating capacitors $C_1$ and $C_2$ are charged by current $-Vi/R_1$ flowing through the integrating resistor $R_1$. If the measured voltage $-Vi$ is flat, integration of the voltage $-Vi$ causes output voltage of the operational amplifier 9 to increase in positive direction at slope proportional to Vi as shown in FIG. 2(A). Predetermined period Ti from the first time $t_1$ to the second time $t_2$ is determined by the counter 15 to count a predetermined amount of clock pulses generated by the clock pulse generator 16 as shown in FIG. 2(B). Total charge amount Q stored in the first and second integrating capacitors $C_1$ and $C_2$ during the period Ti is represented by the formula:

$$Q = \frac{Vi}{R_1} Ti \quad (1)$$

At the second time $t_2$, i.e. the end of the period Ti, the first switch $S_1$ is turned off as shown in FIG. 2(C) and the second switch $S_2$ is turned on as shown in FIG. 2(D). As a result, current $+Vr_1/R_1$ corresponding to voltage $+Vr_1$ of the first reference voltage source 6 is supplied to the integrator 3. Since polarity of the first reference voltage $+Vr_1$ is opposite to that of the measured voltage $-Vi$, output voltage of the operational amplifier 9 decreases at slope proportional to $-Vr_1$ towards the initial value. If output voltage of the operational amplifier 9 attains the detecting voltage level $+Vc$ of the first comparator 11 as shown in FIG. 2(A), output of the comparator 11 is inverted into high level as shown in FIG. 2(I). In response to the first level detecting signal at the third time $t_3$ as shown in FIG. 2(I), the control circuit 14 turns the second switch $S_2$ off as shown in FIG. 2(D). At the same time, the control circuit 14 turns the fifth switch $S_5$ off as shown in FIG. 2(G), and turns the fourth switch $S_4$ on as shown in FIG. 2(F). Changing of the switches $S_2$, $S_4$ and $S_5$ at the third time $t_3$ is effected not only in synchronization with detecting signal of the first detecting voltage level $+Vc$ but in synchronization with clock pulse. In other words, after generation of detecting signal at the time $t_3$ as shown in FIG. 2(I), changing control signal of the switches $S_2$, $S_4$ and $S_5$ is generated in synchronization with clock pulse generated from the clock pulse generator 16 as shown in FIG. 2(I). Therefore the period $Tr_1$ of supplying the first reference voltage $+Vr_1$ can be measured accurately. Discharging amount $Q_1$ of the integrating capacitors $C_1$ and $C_2$ during the period $Tr_1$ to supply the first reference voltage $+Vr_1$ is represented by the formula:

$$Q_1 = \frac{Vr_1}{R_1} Tr_1 \quad (2)$$

If the first integrating capacitor $C_1$ is disconnected from output terminal of the operational amplifier 9 and one end of the capacitor $C_1$ is connected to the ground through the fourth switch $S_4$ at the third time $t_3$, charge in the first integrating capacitor $C_1$ is transferred to the second integrating capacitor $C_2$. The transfer of charge will now be described in detail. During the period Tc from the time $t_3$ to the time $t_4$ in FIG. 2, only the fourth switch $S_4$ is turned on. Therefore charge in the first integrating capacitor $C_1$ is transferred only to the second integrating capacitor $C_2$. The operational amplifier 9 acts so that potential of the inverting input terminal becomes equal to that of the non-inverting input terminal. As a result, voltage at both ends of the first integrating capacitor $C_1$ becomes equal to value at the initial state. When whole charge of the first integrating capacitor $C_1$ is transferred to the second integrating capacitor $C_2$, output voltage of the operational amplifier 9 increases to $(C_1+C_2)/C_2$ times as large as output voltage $+Vc$ at the time $t_3$.

After passage of the period Tc which is set longer than that required for the charge in the first integrating capacitor $C_1$ to be transferred to the second integrating capacitor $C_2$, the third switch $S_3$ is turned on at the fourth time $t_4$ as shown in FIG. 2(E). Thereby current $+Vr_2/R_1$ corresponding to the second reference voltage $+Vr_2$ of the second reference voltage 8 is supplied to the integrator 3. Since the second reference voltage $+Vr_2$ is lower than the first reference voltage $+Vr_1$, output voltage of the operational amplifier 9 decreases at a gentle slope. If the output voltage of the operational amplifier 9 becomes the initial value at the fifth time $t_5$, output of the second comparator 13 is inverted into high level as shown in FIG. 2(J). In response to the signal at the fifth time $t_5$ shown in FIG. 2(J), the control circuit 14 generates signal to turn the third switch $S_3$ off and the sixth switch $S_6$ on. As a result, state of the integrator at the time $t_5$ is set to the same initial state as that before the first time $t_1$ and ready for next analog-to-digital conversion.

The counter 15 counts the number of clock pulses during the period $Tr_1$ from the second time $t_2$ to the third time $t_3$ and feeds it to the arithmetic circuit 17. The counter 15 also counts the number of clock pulses during the period $Tr_2$ from the fourth time $t_4$ to the fifth time $t_5$ and feeds it to the arithmetic circuit 17.

Discharging amount $Q_2$ in the period $Tr_2$ when the second reference voltage $+Vr_2$ is integrated is represented by the formula:

$$Q_2 = \frac{Vr_2}{R_1} Tr_2 \quad (3)$$

Since the total charge amount Q based on the measured voltage $-Vi$ in the period Ti is equal to addition of the discharging amount $Q_1$ and $Q_2$, the following formula is established.

$$Q = Q_1 + Q_2 \quad (4)$$

From formulas (1)–(4), the measured voltage $-Vi$ is represented by the formula:

$$-Vi = -\left(\frac{Vr_1}{Ti} Tr_1 + \frac{Vr_2}{Ti} Tr_2\right) \quad (5)$$

In formula (5), Ti, $Vr_1$ and $Vr_2$ are known, and $Tr_1$ and $Tr_2$ correspond to the number of clock pulses counted by the counter 15. In the arithmetic circuit 17, the number of clock pulses in the period $Tr_1$ is multiplied by the factor $Vr_1/Ti$, the number of clock pulses in the period $Tr_2$ is multiplied by the factor $Vr_2/Ti$, and both products are added, thereby the measured voltage $-Vi$ is obtained in digital form. As clearly seen from formula (5), the measured voltage $-Vi$ is determined irrespective of capacitance values of the first and second integrating capacitors $C_1$ and $C_2$.

As clearly seen from waveform of output voltage of the integrator 3 in FIG. 2(A), in the A-D converter according to this invention, integration output voltage which decreases to $+Vc$ is again raised based on the charge transfer from the first integrating capacitor $C_1$ to the second integrating capacitor $C_2$. As a result, the integration output voltage in FIG. 2(A) has large difference between values at the time $t_4$ and at the time $t_5$. Thereby the second comparator 13 can detect accurately that the integration output voltage returns to the initial value (0 volt). In other words, limitation of the second comparator 13 in its detection capability, gain and response speed is relaxed, and limitation of the integrator 3 in noise is also relaxed.

In FIG. 2, charge in the first integrating capacitor $C_1$ is transferred to the second integrating capacitor $C_2$ at the time $t_3$. If the measured voltage $-Vi$ is quite low, however, operation in the period Tc may be omitted and at the time $t_2$ charge in the first integrating capacitor $C_1$ be transferred to the second integrating capacitor $C_2$. In this case also, amplitude of output voltage of the integrator 3 becomes large and therefore the comparator 13 can detect the initial value easily. Furthermore, when the comparator 13 is utilized to discriminate polarity of the measured voltage, polarity of the measured voltage at quite low level can be accurately discriminated.

Figure 3:
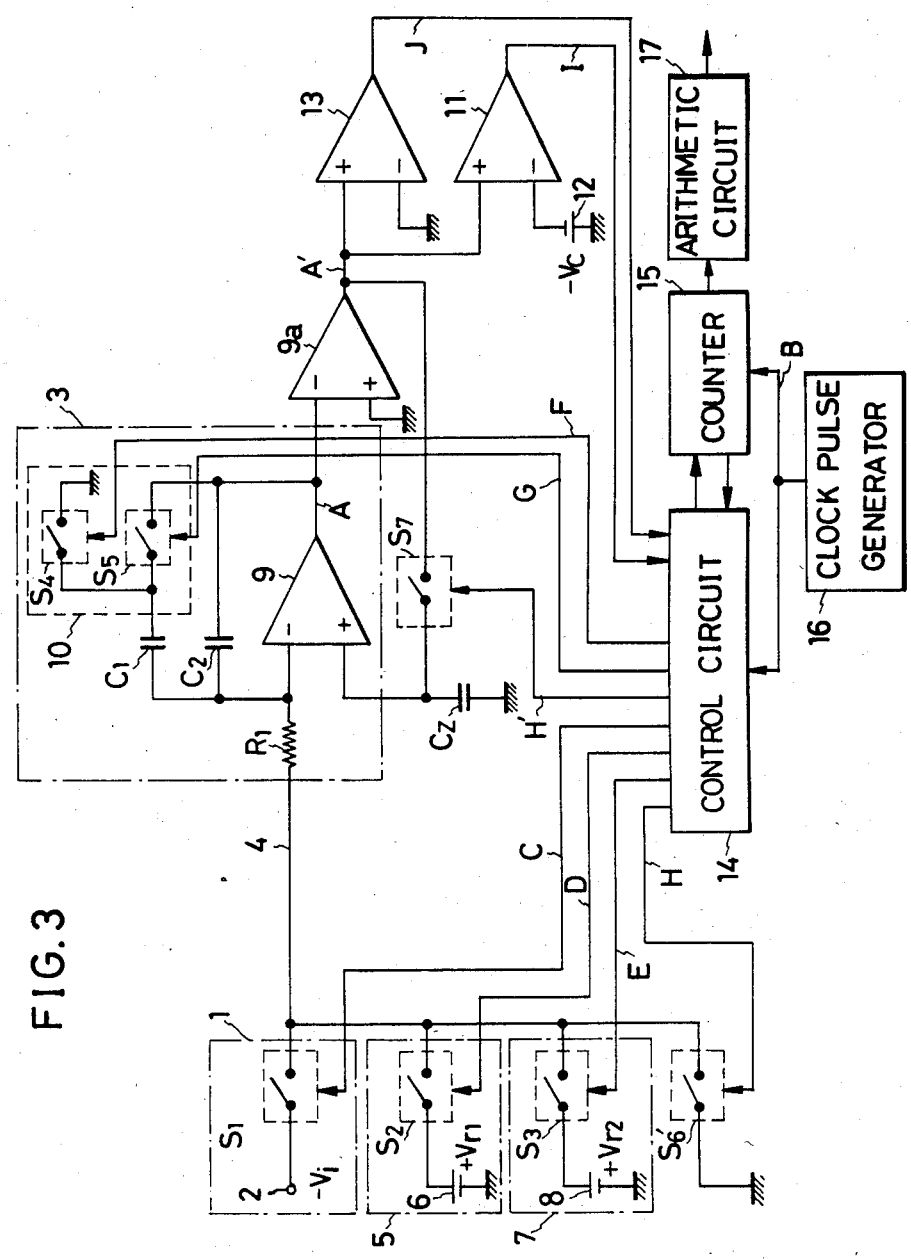
FIG. 3 is a circuit diagram of an A-D converter as another embodiment of this invention.

FIG. 3 shows another embodiment of A-D converter according to this invention. The A-D converter in FIG. 3 includes many parts similar to those in FIG. 1. Therefore like parts are designed by the same reference numeral as in FIG. 1 and description thereof is omitted. Output terminal of an operational amplifier 9 in FIG. 3 is connected to inverting input terminal of a DC amplifier 9a comprising an operational amplifier. Non-inverting input terminal of the DC amplifier 9a is connected to the ground. As a result, the DC amplifier 9a functions as an inverting amplifier.

Non-inverting input terminals of a first comparator 11 and a second comparator 13 are connected to output terminal of the DC amplifier 9a. Inverting input terminal of the first comparator 11 is connected to a reference voltage source 12 so as to detect output voltage $-Vc$ of the DC amplifier 9a corresponding to predetermined output voltage $+Vc$ of an integrator 3. Inverting input terminal of the second comparator 13 is connected to the ground so as to obtain the ground level corresponding substantially to the initial value.

A capacitor Cz to store offset voltage is connected between non-inverting input terminal of the operational amplifier 9 and the ground. A seventh switch $S_7$ is connected between output terminal of the DC amplifier 9a and the capacitor Cz so as to supply offset voltage to the capacitor Cz only during a selected period. A sixth switch $S_6'$ is connected between an integration input line 4 and the ground so as to obtain the initial state of the integrator 3.

Figure 4:
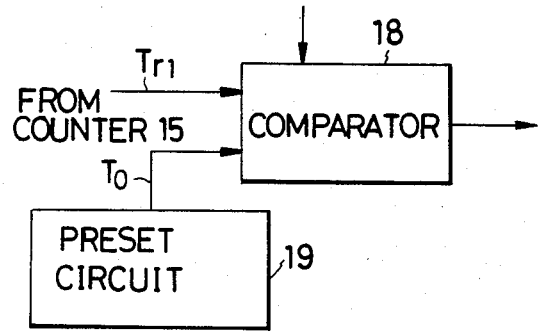
FIG. 4 is a block diagram showing in principle a circuit for detecting excessive measured voltage in the A-D converter of FIG. 3.

A control circuit 14 comprising a microprocessor in FIG. 3 has the same function as that of a discriminating circuit shown in principle in FIG. 4. The discriminating circuit shown in FIG. 4 comprises a comparator 18 and a preset circuit 19. Digital value corresponding to a predetermined period $T_o$ is previously set to the preset circuit 19. The comparator 18 discriminates whether or not the period $Tr_1$ of integrating the first reference voltage $+Vr_1$ attains the period $T_o$ corresponding to preset value based on output of a counter 15.

Figure 5:
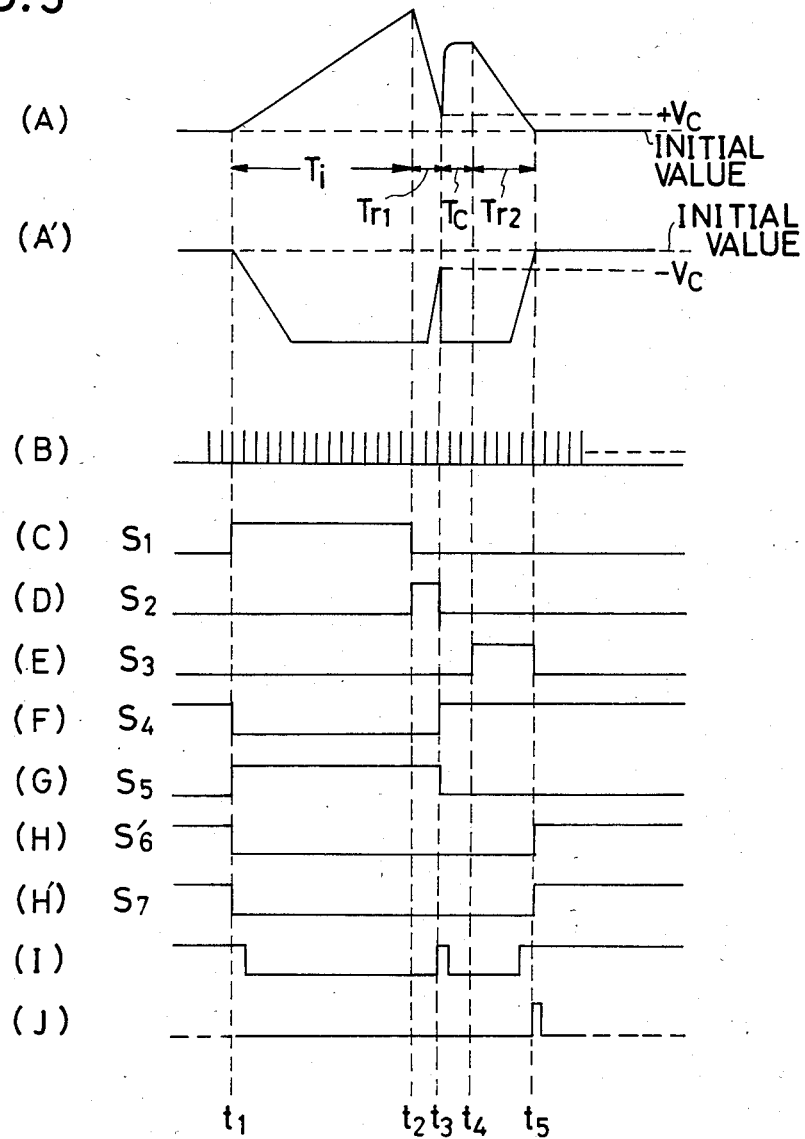
FIG. 5 is a waveform chart in various stages of the A-D converter in FIG. 3 during normal operation.

FIG. 5 shows voltage waveform in various parts of the A-D converter of FIG. 3 in normal operation. Waveform of FIG. 5(A),(B),(C),(D),(E),(F),(G),(H),(I),(J) corresponds to that in FIG. 2(A),(B),(C),(D),(E),(F),(G),(H),(I),(J). FIG. 5(A') shows output voltage of the DC amplifier 9a. Since the DC amplifier 9a has large amplification degree and performs saturation action, output waveform of the DC amplifier 9a is not the same as that in FIG. 5(A). FIG. 5(H') shows control signal of the seventh switch $S_7$.

The fourth switch $S_4$, sixth switch $S_6'$ and seventh switch $S_7$ are turned on before the time $t_1$ in FIG. 5. As a result, charge in the first integrating capacitor $C_1$ is discharged through the discharge circuit consisting of the fourth switch $S_4$, the first integrating capacitor $C_1$, the resistor $R_1$, the input line 4 and the sixth switch $S_6'$. Charge in the second integrating capacitor $C_2$ is discharged through the resistor $R_1$ and the sixth switch $S_6'$. A capacitor Cz holds output voltage of the DC amplifier 9a, i.e. offset voltage Vz. The sixth switch $S_6'$ and the seventh switch $S_7$ are turned off from the time $t_1$ to the time $t_5$ in FIG. 5. The first comparator 11 and the second comparator 13 detect the time when output voltage of the DC amplifier 9a becomes $-Vc$ and the time when it becomes the initial value. Detection of the voltage $-Vc$ and initial value in FIG. 5(A') is equivalent to detection of the voltage $+Vc'$ and initial value in FIG. 5(A).

Offset voltage compensating circuit composed of the capacitor Cz and the switch $S_7$ is substantially the same as the system disclosed by Uchida in U.S. Pat. No. Re. 28,579 reissued on Oct. 21, 1975.

As clearly seen from FIG. 5, working of the A-D converter in FIG. 3 is substantially the same as that in FIG. 1 as long as the measured voltage has normal value. On the other hand, if the A-D converter in FIG. 3 is supplied with the measured voltage having excessive value beyond the maximum digital output of the A-D converter, the A-D converter in FIG. 3 acts as shown in FIG. 6 (A)-(J). FIG. 6 (A)-(J) shows waveform of the same parts as those in FIG. 5 (A)-(J) respectively. When the excessive measured voltage $-Vi$ is supplied to the integrator 3 for the predetermined period Ti, charge amount in the first and second integrating capacitors $C_1$ and $C_2$ increases and output voltage of the operational amplifier 9 at the time $t_2$ becomes higher than that in FIG. 5(A). If integration of the first reference voltage $+Vr_1$ starts at the time $t_2$, output voltage of the operational amplifier 9 begins to decrease. However, since output voltage at the time $t_2$ is high, output voltage of the DC amplifier 9a cannot attain the detected voltage level $-Vc$ in a short time. If supply of the first reference voltage $+Vr_1$ is maintained until output voltage of the DC amplifier 9a attains the detected voltage level $-Vc$, speed of the analog-to-digital conversion becomes slow. In order to eliminate above-mentioned disadvantages, the A-D converter in FIG. 3 discriminates whether or not the period $Tr_1$ supplying the first reference voltage $+Vr_1$ attains the predetermined period $T_o$.

The comparator 18 shown in FIG. 4 compares data obtained from the counter 15 for representing the period $Tr_1$ with data obtained from the preset circuit 19 for representing the predetermined period $T_o$ and generates command signal to set the initial state at the time $t_3$ in FIG. 6 when the period $Tr_1$ is equal to the period $T_o$. If the second switch $S_2$ and the fifth switch $S_5$ are turned off and the fourth switch $S_4$, the sixth switch $S_6'$ and the seventh switch $S_7$ are turned on at the time $t_3$ of FIG. 6, the integration input line 4 is connected through the sixth switch $S_6'$ to the ground, the first integrating capacitor $C_1$ is disconnected from output terminal of the operational amplifier 9 by the fifth switch $S_5$, and the first integrating capacitor $C_1$ is connected through the fourth switch $S_4$ to the ground. Therefore charge in the first integrating capacitor $C_1$ is discharged at the time constant $C_1R_1$. Output terminal of the DC amplifier $9a$ is connected through the seventh switch $S_7$ to the capacitor $Cz$. Thereby the A-D converter in FIG. 1 is set to the initial state and next analog-to-digital conversion becomes possible after a short time.

Figure 7:
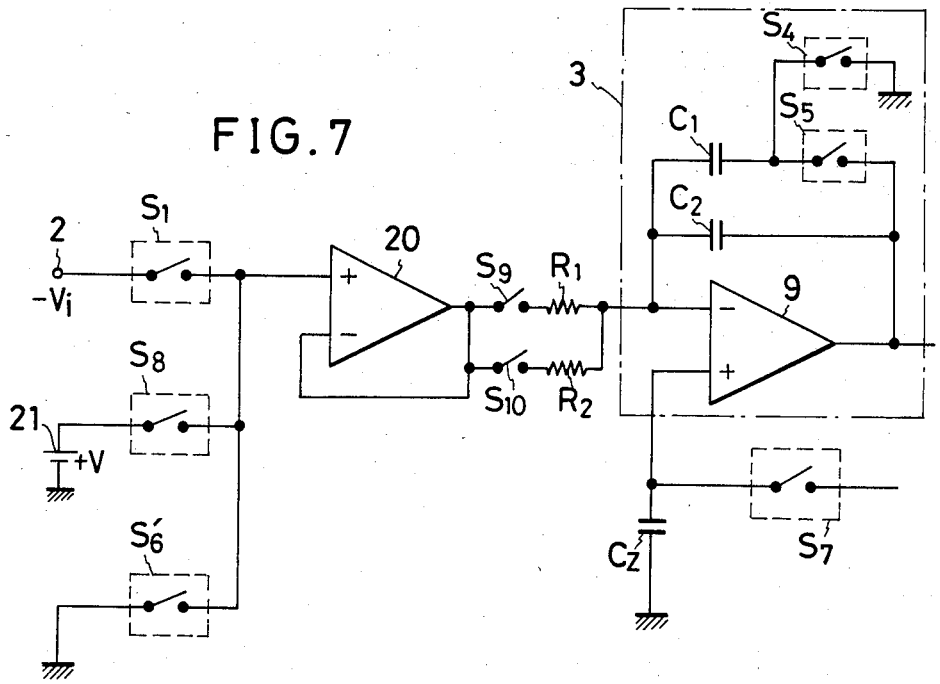
FIG. 7 is a circuit diagram illustrating partly an A-D converter as a modification of this invention.

The preferred embodiment disclosed herein is meant purely to illustrate or explain and not to impose limitations upon the invention, as a variety of modifications will readily occur to the specialists on the basis of this disclosure. The following is a brief list of such possible modifications:

(1) FIG. 7 shows an A-D converter as a partial modification of that shown in FIG. 3. The A-D converter has a pre-amplifier 20, a reference voltage source 21, three switches $S_8$, $S_9$ and $S_{10}$, and two reference resistors $R_1$ and $R_2$. Non-inverting input terminal of the pre-amplifier 20 is connected through the first switch $S_1$ to input terminal 2 to supply the measured voltage, through the switch $S_8$ to the reference voltage source 21, and through the switch $S_6'$ to the ground. Between output terminal of the pre-amplifier 20 and the operational amplifier 9 of the integrator 3, the resistor $R_1$ is connected through the switch $S_9$ and the resistor $R_2$ is connected through the switch $S_{10}$.

Operation of the three newly installed switches $S_8$, $S_9$ and $S_{10}$ will now be described referring to periods Ti, $Tr_1$, Tc, $Tr_2$ and period after the time $t_5$ as shown in FIG. 5. During the period Ti, only the switch $S_9$ is turned on and other switches $S_8$ and $S_{10}$ are off. During the period $Tr_1$, the switches $S_8$ and $S_9$ are turned on and the switch $S_{10}$ is off. During the period Tc, the switches $S_9$ and $S_{10}$ are turned off and the switch $S_8$ is on. During the period $Tr_2$, the switches $S_8$ and $S_{10}$ are turned on and the switch $S_9$ is off. At the period after the time $t_5$, the switch $S_9$ is turned on and the switches $S_8$ and $S_{10}$ are off. The switches $S_1$, $S_4$, $S_5$, $S_6'$ and $S_7$ are operated according to control signals shown in FIG. 5.

As a result, during the period $Tr_1$ first reference current specified by the reference voltage source 21 and the first resistor $R_1$ is supplied to the integrator 3. During the period $Tr_2$ second reference current $+V/R_2$ specified by the reference voltage source 21 and the second resistor $R_2$ is similarly supplied to the integrator 3. Since $+V$, $R_1$ and $R_2$ are known, digital output is obtained in similar manner to the A-D converter in FIG. 1.

Figure 8:
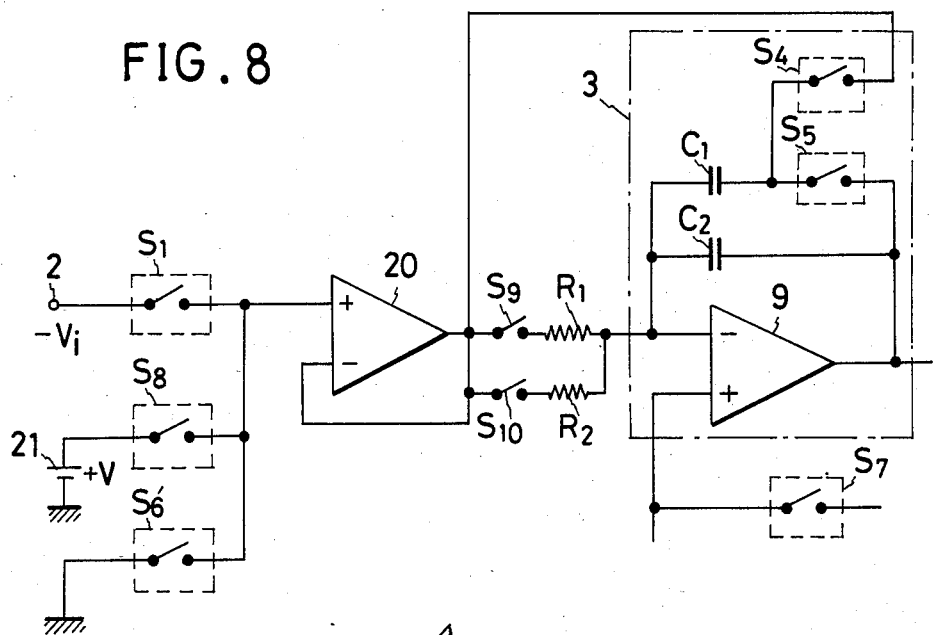
FIG. 8 is a circuit diagram illustrating partly an A-D converter as another modification of this invention.

(2) FIG. 8 shows an A-D converter as a partial modification of that shown in FIG. 7. In the A-D converter of FIG. 8, the fourth switch $S_4$ is not connected to the ground but to output terminal of the pre-amplifier 20. Switches $S_1$, $S_4$, $S_5$, $S_7$, $S_8$, $S_9$ and $S_{10}$ are operated in similar manner to corresponding switches in FIG. 7 respectively. The switch $S_6'$ is turned on before the time $t_1$, after the time $t_5$ and during the period Tc as shown in FIG. 5. As a result, when charge in the first integrating capacitor $C_1$ is transferred to the second integrating capacitor $C_2$, one end of the first capacitor $C_1$ is connected through the fourth switch $S_4$ to output terminal of the pre-amplifier 20 being at ground level. When the integrator 3 is set to the initial state, charge in the first integrating capacitor $C_1$ is discharged through the closed circuit consisting of the fourth switch $S_4$, the ninth switch $S_9$ and the resistor $R_1$.

Figure 9:
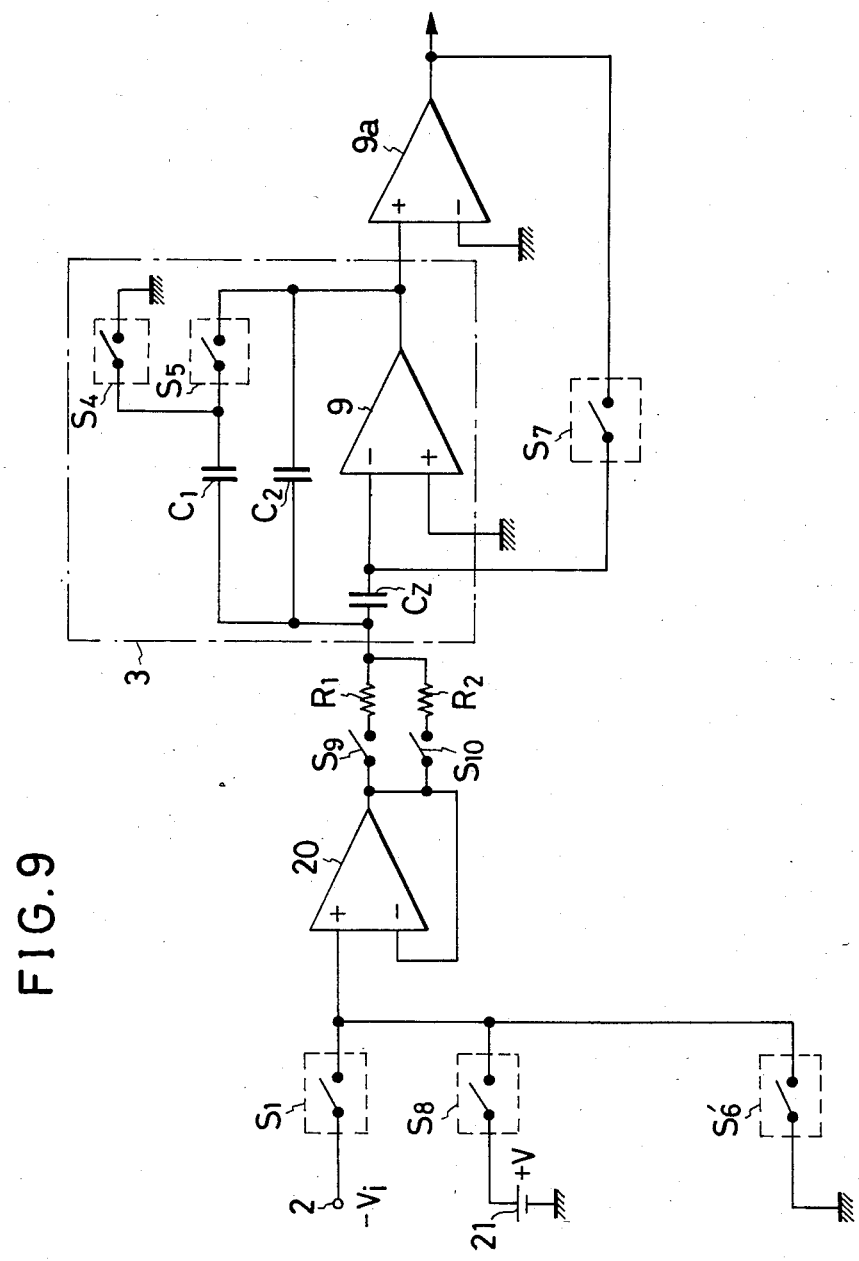
FIG. 9 is a circuit diagram illustrating partly an A-D converter as a still another modification of this invention.

(3) FIG. 9 shows an A-D converter as a partial modification of that shown in FIG. 7. In the A-D converter of FIG. 9, the capacitor $Cz$ for storing the offset voltage is connected between inverting input terminal of the operational amplifier 9 and the resistor $R_1$. Non-inverting input terminal of the DC amplifier $9a$ is connected to output terminal of the operational amplifier 9, and inverting input terminal of the DC amplifier $9a$ is connected to the ground. As a result, the DC amplifier $9a$ functions as a non-inverting amplifier. Switches $S_1$, $S_4$, $S_5$, $S_6'$, $S_7$, $S_8$, $S_9$ and $S_{10}$ are operated in similar manner to corresponding switches in FIG. 7 respectively.

Figure 10:
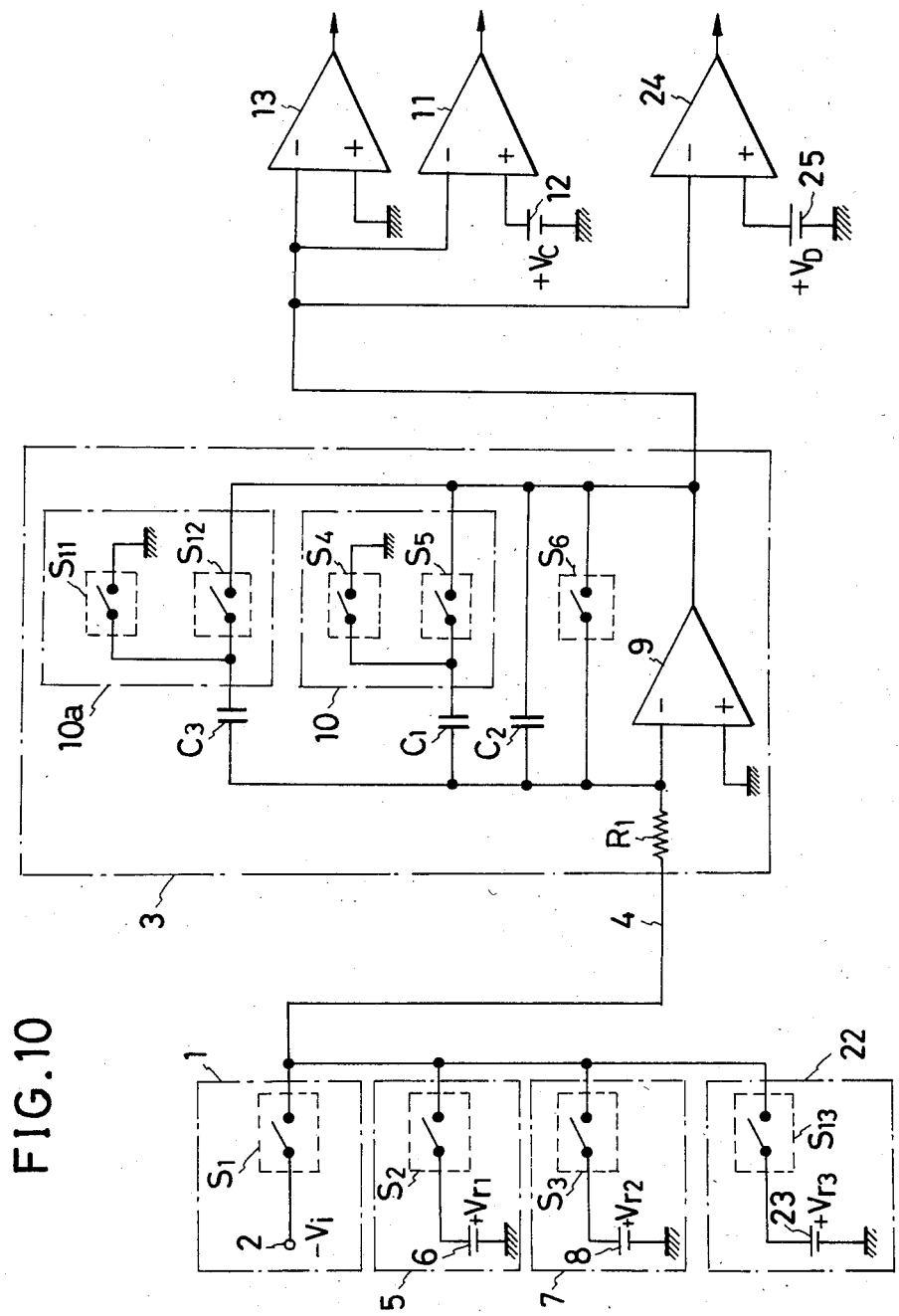
FIG. 10 is a circuit diagram illustrating partly an A-D converter as a further modification of this invention.

(4) FIG. 10 shows an A-D converter having a third integrating capacitor $C_3$ in addition to the A-D converter of FIG. 1. In FIG. 10, one end of the third integrating capacitor $C_3$ is connected through a switch $S_{11}$ to the ground and through a switch $S_{12}$ to output terminal of the operational amplifier 9. A charge transfer circuit $10a$ for the third integrating capacitor $C_3$ comprises the switches $S_{11}$ and $S_{12}$. A third reference input supply circuit 22 added herein comprises a third reference voltage source 23 and a switch $S_{13}$, and is connected to the integration input line 4. Inverting input terminal of a comparator 24 added herein is connected to output terminal of the operational amplifier 9, and non-inverting input terminal of the comparator 24 is connected to a reference voltage source 25.

Figure 11:
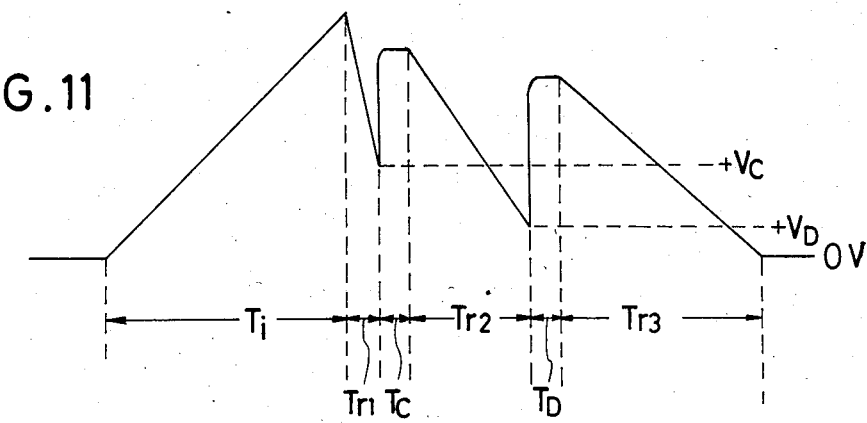
FIG. 11 is a waveform chart illustrating output voltage of an integrator of the A-D converter in FIG. 10.

Operation of the A-D converter in FIG. 10 will now be described referring to FIG. 11. During the period Ti of FIG. 11, switches $S_1$, $S_5$ and $S_{12}$ are turned on, and the measured voltage $-Vi$ is integrated in the first, second and third integrating capacitors $C_1$, $C_2$, $C_3$. During the next period $Tr_1$, switches $S_2$, $S_5$ and $S_{12}$ are turned on, and the first reference voltage $+Vr_1$ is integrated in the first, second and third capacitors $C_1$, $C_2$, $C_3$. If output voltage of the integrator 3 becomes the voltage level $+Vc$, output of the comparator 11 is inverted from low level into high level thereby the time of end of the period $Tr_1$ is detected. In response to output of the comparator 11, the switch $S_4$ is turned off and the switch $S_5$ is turned on. As a result, charge in the first integrating capacitor $C_1$ is transferred to the second and third capacitors $C_2$, $C_3$. During the period $Tr_2$, the second reference voltage $+Vr_2$ is integrated in the second and third capacitors $C_2$, $C_3$. If output voltage of the integrator 3 becomes the voltage level $+V_D$, output of the comparator 24 is inverted from low level into high level thereby the time of end of the period $Tr_2$ is detected. In response to output of the comparator 24, the switch $S_{11}$ is turned on and the switch $S_{12}$ is turned off. As a result, charge in the third integrating capacitor $C_3$ is transferred to the second integrating capacitor $C_2$. During the period $Tr_3$, the third reference voltage $+Vr_3$ is integrated in the second integrating capacitor $C_2$. If output voltage of the integrator 3 becomes the initial value, output of the comparator 13 is inverted from low level into high level thereby the time of end of the period $Tr_3$ is detected. Digital output corresponding to the measured voltage $-Vi$ is obtained based on the known period Ti, the measured periods $Tr_1$, $Tr_2$, $Tr_3$ and the known reference voltage $+Vr_1$, $+Vr_2$, $+Vr_3$. Although the analog-to-digital conversion system based on integration at four stages has been described in FIG. 10 and FIG. 11, the integration at further more stages may be performed.

Figure 12:
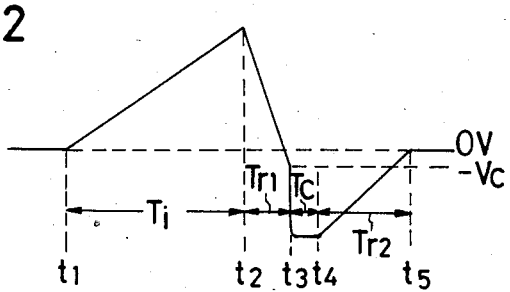
FIG. 12 is a waveform chart illustrating output voltage of the integrator of A-D converter as a modification of this invention.

(5) In the A-D converter of FIG. 1, the second reference voltage may be made negative voltage $-V_{r2}$ and the reference voltage of the comparator 11 be made $-V_c$. As shown in FIG. 12, integration of the first reference voltage $+V_{r1}$ is performed beyond the initial value (0 volt) to the negative voltage level $-V_c$. Next, charge in the first integrating capacitor $C_1$ is transferred to the second integrating capacitor $C_2$. Finally, the second reference voltage $-V_{r2}$ is integrated until attaining the initial value. In FIG. 12, the detecting level $-V_c$ may be approached to the initial value (0 volt), and, in place of detection of the initial value (0 volt) at the time $t_5$, the detecting level $-V_c$ may be detected. In this constitution, the comparator 13 as shown in FIG. 1 may be omitted.

(6) Polarity of the measured voltage supplied from the input terminal 2 may be made positive, and voltage of the reference voltage sources 6, 8 be made negative.

(7) Amplification degree of the DC amplifier 9a in FIG. 3 may be made large, and when the output voltage attains the initial value the time $t_5$ of FIG. 5 may be detected. In this constitution, the second comparator 13 may be omitted.

(8) Each one end of the switches $S_4$, $S_6$, $S_6'$ and the capacitor $C_z$ is not grounded, but may be provided with a given voltage. Inverting input terminal of the comparator 13 may be provided with a given voltage corresponding to the initial value.

(9) Clock pulse frequency in the period $T_{r1}$ may be different from that in the period $T_{r2}$.

(10) In the A-D converter of FIG. 3, when the initial state of the integrator 3 is set, the resistor $R_1$ may be shortcircuited at the period after the time $t_5$ of FIG. 5 or at the period after the time $t_3$ of FIG. 6 in order to reduce the discharging time of the integrating capacitors $C_1$ and $C_2$. Otherwise the first integrating capacitor $C_1$ may be shortcircuited during the above-mentioned period.

What is claimed is:

1. A method of converting an analog voltage of a polarity to a digital value, which comprises:
   (a) providing an integrator having a predetermined normal output voltage and including first and second integrating capacitors;
   (b) integrating an analog input voltage for a preassigned period of time by the integrator;
   (c) integrating a first reference input, opposite in polarity to the analog input voltage, by the integrator after the lapse of the preassigned period of time, until the output voltage of the integrator reaches a predetermined level;
   (d) transferring a charge on the first integrating capacitor to the second integrating capacitor, and electrically isolating the first integrating capacitor from the integrator, when the output voltage of the integrator reaches the predetermined level;
   (e) integrating a second reference input by the integrator with use of the second integrating capacitor upon completion of the charge transfer from the first to the second integrating capacitor, until the output voltage of the integrator becomes equal to the predetermined normal output voltage thereof;
   (f) measuring the periods of time during which the first and second reference inputs are being integrated; and
   (g) providing a digital output corresponding to the analog input voltage on the bases of the preassigned period of time during which the analog input voltage has been integrated, the measured periods of time during which the first and second reference inputs have been integrated, and the values of the first and second reference inputs.

2. The analog to digital converting method of claim 1 wherein the first and second reference inputs are both in the form of voltages.

3. The analog to digital converting method of claim 1 wherein the first and second reference inputs are both in the form of current.

4. The analog to digital converting method of claim 1 wherein the first integrating capacitor is greater in capacitance than the second integrating capacitor.

5. The analog to digital converting method of claim 1 which further comprises;
   (a) ascertaining whether or not the first reference input has been integrated for a second preassigned length of time; and
   (b) electrically isolating the first integrating capacitor from the integrator, causing the first integrating capacitor to discharge, and returning the integrator to a state ready for the next cycle of analog to digital conversion, when the first reference input has been integrated for the second preassigned length of time.

6. An integrating analog to digital converter for converting an analog input voltage of a polarity to a digital value, comprising:
   (a) an integrator having a predetermined normal output voltage and including at least first and second integrating capacitors;
   (b) first input means for delivering an analog input voltage to the integrator for a preassigned period of time;
   (c) second input means for delivering a first reference input, opposite in polarity to the analog input voltage, to the integrator after the delivery of the analog input voltage thereto from the first input means;
   (d) first comparison means for producing an output indicative of the moment when the output voltage of the integrator reaches a predetermined level as a result of the integration of the first reference input;
   (e) control means responsive to the output from the first comparison means for terminating the delivery of the first reference input from the second input means to the integrator;
   (f) charge transfer means also responsive to the output from the first comparison means for causing the transfer of a charge on the first integrating capacitor of the integrator to the second integrating capacitor thereof and for electrically isolating the first integrating capacitor from the integrator;
   (g) third input means for delivering a second reference input to the integrator following the transfer of the charge from the first to the second integrating capacitor;
   (h) second comparison means for producing an output indicative of the moment when the output voltage of the integrator substantially becomes equal to the predetermined output voltage thereof as a result of the integration of the second reference input;
   (i) a source of clock pulses; and (j) counter and output means coupled to the source for measuring the periods of time during which the first and second reference inputs are integrated by the integrator, by counting the clock pulses produced during such time periods, the counter and output means being further coupled to the first and second comparison means for providing a digital output corresponding to the analog input voltage on the bases of the preassigned period of time during which the analog input voltage is integrated by the integrator, the measured periods of time during which the first and second reference inputs are integrated by the integrator, and the values of the first and second reference inputs.

7. The analog to digital converter of claim 6 wherein the integrator further comprises an amplifier, and wherein the first and second integrating capacitors are connected in parallel with each other and across the amplifier.

8. The analog to digital converter of claim 7 wherein the charge transfer means comprises:
   (a) a switch responsive to the output from the first comparison means for connecting the first integrating capacitor of the integrator to a source of a predetermined potential; and
   (b) another switch also responsive to the output from the first comparison means for disconnecting the first integrating capacitor from an output of the amplifier.

9. The analog to digital converter of claim 8 wherein the predetermined potential is a ground potential.

10. The analog to digital converter of claim 6 wherein the first input means comprises an input terminal for the inputting of the analog input voltage, and a first switch connected between the input terminal and the integrator, wherein the second input means comprises a first reference voltage source, and a second switch connected between the first reference voltage source and the integrator, and wherein the third input means comprises a second reference voltage source, and a third switch connected between the second reference voltage source and the integrator.

11. The analog to digital converter of claim 6 wherein the second input means comprises a reference voltage source, and a resistor connected between the reference voltage source and the integrator, and a switch connected between the reference voltage source and the resistor, whereby the first reference input is supplied in the form of current to the integrator during the closure of the resistor, and wherein the third input means comprises a second resistor connected between the reference voltage source and the integrator and a switch connected between the reference voltage source and the second resistor, whereby the second reference input is supplied in the form of current to the integrator during the closure of the second resistor.

12. The analog to digital converter of claim 6 wherein the first integrating capacitor of the integrator is greater in capacitance than the second integrating capacitor thereof.

13. The analog to digital converter of claim 6 further comprising:
   (a) means for ascertaining whether or not the first reference input has been integrated for a second preassigned length of time; and
   (b) means associated with the ascertaining means for electrically isolating the first integrating capacitor from the integrator, causing the first integrating capacitor to discharge, and returning the integrator to a state ready for the next cycle of analog to digital conversion, when the first reference input has been integrated for the second preassigned length of time.

14. The analog to digital converter of claim 6 further comprising an amplifier connected between the first input means and the integrator.

15. The analog to digital converter of claim 6 wherein the integrator further comprises an amplifier, wherein the first and second integrating capacitors are connected in parallel with each other and across the amplifier, and wherein the converter further comprises:
   (a) a direct current amplifier connected between an output of the amplifier of the integrator and the first and second comparison means;
   (b) a capacitor connected to an input of the amplifier of the integrator for correcting for an offset voltage; and
   (c) a switch connected between an output of the direct current amplifier and the capacitor and adapted to be closed on completion of each cycle of analog to digital conversion.

16. An integrating analog to digital converter for converting an analog input voltage of a polarity to a digital value, comprising:
   (a) an integrator having a predetermined normal output voltage and including a plurality of integrating capacitors in parallel connection with each other;
   (b) first input means for delivering an analog input voltage to the integrator for a preassigned period of time;
   (c) second input means for sequentially delivering a plurality of reference inputs to the integrator after the delivery of the analog input voltage thereto from the first input means, the reference inputs having polarities so determined as to return the output voltage of the integrator to the predetermined normal voltage;
   (d) comparison means for sequentially producing outputs indicative respectively of the moments when the integrator produces predetermined different output voltages, including the normal voltage, as a result of the sequential integration of the reference inputs, the last produced output of the comparison means being indicative of the moment when the integrator output returns to the normal voltage;
   (e) charge transfer means responsive to each of all but the last of the outputs from the comparison means for causing the transfer of a charge on a selected one of the integrating capacitors of the integrator to another of the integrating capacitors and for electrically isolating the selected integrating capacitor from the integrator;
   (f) a source of clock pulses; and
   (g) counter and output means coupled to the source for measuring the periods of time during which the reference inputs are integrated by the integrator, by counting the clock pulses produced during such time periods, the counter and output means being further coupled to the comparison means for providing a digital output corresponding to the analog input voltage on the bases of the preassigned period of time during which the analog input voltage is integrated by the integrator, the measured periods of time during which the reference inputs are integrated by the integrator, and the values of the reference inputs.

* * * * *